(12) United States Patent
Rofougaran et al.

(10) Patent No.: US 9,157,994 B2
(45) Date of Patent: Oct. 13, 2015

(54) DYNAMIC RANGE DETECTION AND POSITIONING UTILIZING LEAKY WAVE ANTENNAS

(71) Applicant: Broadcom Corporation, Irvine, CA (US)

(72) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 20 days.

(21) Appl. No.: 14/069,781

(22) Filed: Nov. 1, 2013

(65) Prior Publication Data

US 2014/0085126 A1 Mar. 27, 2014

Related U.S. Application Data

(63) Continuation of application No. 12/797,203, filed on Jun. 9, 2010, now Pat. No. 8,577,314.

(60) Provisional application No. 61/185,245, filed on Jun. 9, 2009, provisional application No. 61/246,618, filed on Sep. 29, 2009.

(51) Int. Cl.

| H04B 1/04 | (2006.01) |
| G01S 13/06 | (2006.01) |
| H01Q 1/22 | (2006.01) |
| H01Q 13/22 | (2006.01) |
| H01Q 13/20 | (2006.01) |
| H04B 5/00 | (2006.01) |
| H04B 7/24 | (2006.01) |
| H01Q 15/00 | (2006.01) |

(52) U.S. Cl.
CPC ............. *G01S 13/06* (2013.01); *H01Q 1/2283* (2013.01); *H01Q 13/20* (2013.01); *H01Q 13/22* (2013.01); *H04B 1/04* (2013.01); *H04B 1/0458* (2013.01); *H04B 5/0031* (2013.01); *H04B 7/24* (2013.01); *H01Q 15/006* (2013.01); *Y10T 307/25* (2015.04)

(58) Field of Classification Search
CPC .................................. G01S 13/02; G01S 11/00
USPC ........... 455/129, 121, 269, 67.11, 127.2, 272, 455/66.1, 456.1, 276.1; 342/104, 386, 909, 342/432
See application file for complete search history.

(56) References Cited

U.S. PATENT DOCUMENTS

| 7,764,232 B2 * | 7/2010 | Achour et al. .......... 343/700 MS |
| 2010/0148940 A1 * | 6/2010 | Gelvin et al. ............ 340/286.02 |

* cited by examiner

*Primary Examiner* — John J Lee
(74) *Attorney, Agent, or Firm* — Oblon, McClelland, Maier & Neustadt, L.L.P.

(57) ABSTRACT

Methods and systems for dynamic range detection and positioning utilizing leaky wave antennas (LWAs) are disclosed and may include configuring one or more LWAs to enable communication of signals in a particular direction. RF signals that are reflected from an object may be received via the LWAs, and a location of the object may be determined based on the received reflected RF signals. The velocity of the object may be determined based on a Doppler shift associated with the received reflected RF signals. A frequency chirped signal may be transmitted by the LWAs to determine a location of the object. A resonant frequency of the LWAs may be configured utilizing micro-electro-mechanical systems (MEMS) deflection. LWAs may be situated along a plurality of axes in the wireless device. The LWAs may include microstrip or coplanar waveguides, where a cavity height is dependent on spacing between conductive lines in the waveguides.

20 Claims, 10 Drawing Sheets

DYNAMIC RANGE DETECTION AND POSITIONING UTILIZING LEAKY WAVE ANTENNAS

CROSS-REFERENCE TO RELATED APPLICATIONS/INCORPORATION BY REFERENCE

This is a continuation of application Ser. No. 12/797,203 filed Jun. 9, 2010.

This application makes reference to, claims the benefit from, and claims priority to U.S. Provisional Application Ser. No. 61/246,618 filed on Sep. 29, 2009, and U.S. Provisional Application Ser. No. 61/185,245 filed on Jun. 9, 2009.

This application also makes reference to:
U.S. patent application Ser. No. 12/650,212 filed on Dec. 30, 2009;
U.S. patent application Ser. No. 12/650,295 filed on Dec. 30, 2009;
U.S. patent application Ser. No. 12/650,277 filed on Dec. 30, 2009;
U.S. patent application Ser. No. 12/650,192 filed on Dec. 30, 2009;
U.S. patent application Ser. No. 12/650,224 filed on Dec. 30, 2009;
U.S. patent application Ser. No. 12/650,176 filed on Dec. 30, 2009;
U.S. patent application Ser. No. 12/650,246 filed on Dec. 30, 2009;
U.S. patent application Ser. No. 12/650,292 filed on Dec. 30, 2009;
U.S. patent application Ser. No. 12/650,324 filed on Dec. 30, 2009;
U.S. patent application Ser. No. 12/708,366 filed on Feb. 18, 2010;
U.S. patent application Ser. No. 12/751,550 filed on Mar. 31, 2010;
U.S. patent application Ser. No. 12/751,768 filed on Mar. 31, 2010;
U.S. patent application Ser. No. 12/751,759 filed on Mar. 31, 2010;
U.S. patent application Ser. No. 12/751,593 filed on Mar. 31, 2010;
U.S. patent application Ser. No. 12/751,772 filed on Mar. 31, 2010;
U.S. patent application Ser. No. 12/751,777 filed on Mar. 31, 2010;
U.S. patent application Ser. No. 12/751,782 filed on Mar. 31, 2010;
U.S. patent application Ser. No. 12/751,792 filed on Mar. 31, 2010;
U.S. patent application Ser. No. 12/790,279 filed on May 28, 2010;
U.S. patent application Ser. No. 12/797,029 filed on even date herewith;
U.S. patent application Ser. No. 12/797,133 filed on even date herewith;
U.S. patent application Ser. No. 12/797,162 filed on even date herewith;
U.S. patent application Ser. No. 12/796,177 filed on even date herewith;
U.S. patent application Ser. No. 12/797,822 filed on even date herewith;
U.S. patent application Ser. No. 12/796,214 filed on even date herewith;
U.S. patent application Ser. No. 12/797,841 filed on even date herewith;
U.S. patent application Ser. No. 12/796,232 filed on even date herewith;
U.S. patent application Ser. No. 12/796,862 filed on even date herewith;
U.S. patent application Ser. No. 12/797,975 filed on even date herewith;
U.S. patent application Ser. No. 12/797,041 filed on even date herewith;
U.S. patent application Ser. No. 12/797,112 filed on even date herewith;
U.S. patent application Ser. No. 12/797,254 filed on even date herewith;
U.S. patent application Ser. No. 12/797,273 filed on even date herewith; and
U.S. patent application Ser. No. 12/797,316 filed on even date herewith.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for dynamic range detection and positioning utilizing leaky wave antennas.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for dynamic range detection and positioning utilizing leaky wave antennas as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for dynamic range detection and positioning utilizing leaky wave antennas. Exemplary aspects of the invention may comprise configuring one or more leaky wave antennas to enable communication of signals in a particular direction. RF signals that are reflected from an object may be received via the configured one or more leaky wave antennas, and a location of the object may be determined based on the received reflected RF signals. The velocity of the object may be determined based on a Doppler shift associated with the received reflected RF signals. A frequency may be chirped of an RF signal transmitted by the configured one or more leaky wave antennas. A location of the object may be determined based on the received reflected RF signals resulting from the chirping of the frequency of the transmitted RF signal. A resonant frequency of the one or more leaky wave antennas may be configured utilizing micro-electro-mechanical systems (MEMS) deflection. One or more leaky wave antennas may be situated along a plurality of axes in the wireless device. The one or more leaky wave antennas may comprise microstrip waveguides, where a cavity height of the one or more leaky wave antennas is dependent on spacing between conductive lines in the microstrip waveguides. The one or more leaky wave antennas may comprise coplanar waveguides, wherein a cavity height of the one or more leaky wave antennas is dependent on spacing between conductive lines in the coplanar waveguides. The one or more leaky wave antennas may be integrated in one or more integrated circuits flip-chip bonded to one or more integrated circuit packages, in one or more integrated circuit packages flip-chip bonded to one or more printed circuit boards, and/or one in or more printed circuit boards.

Figure 1:
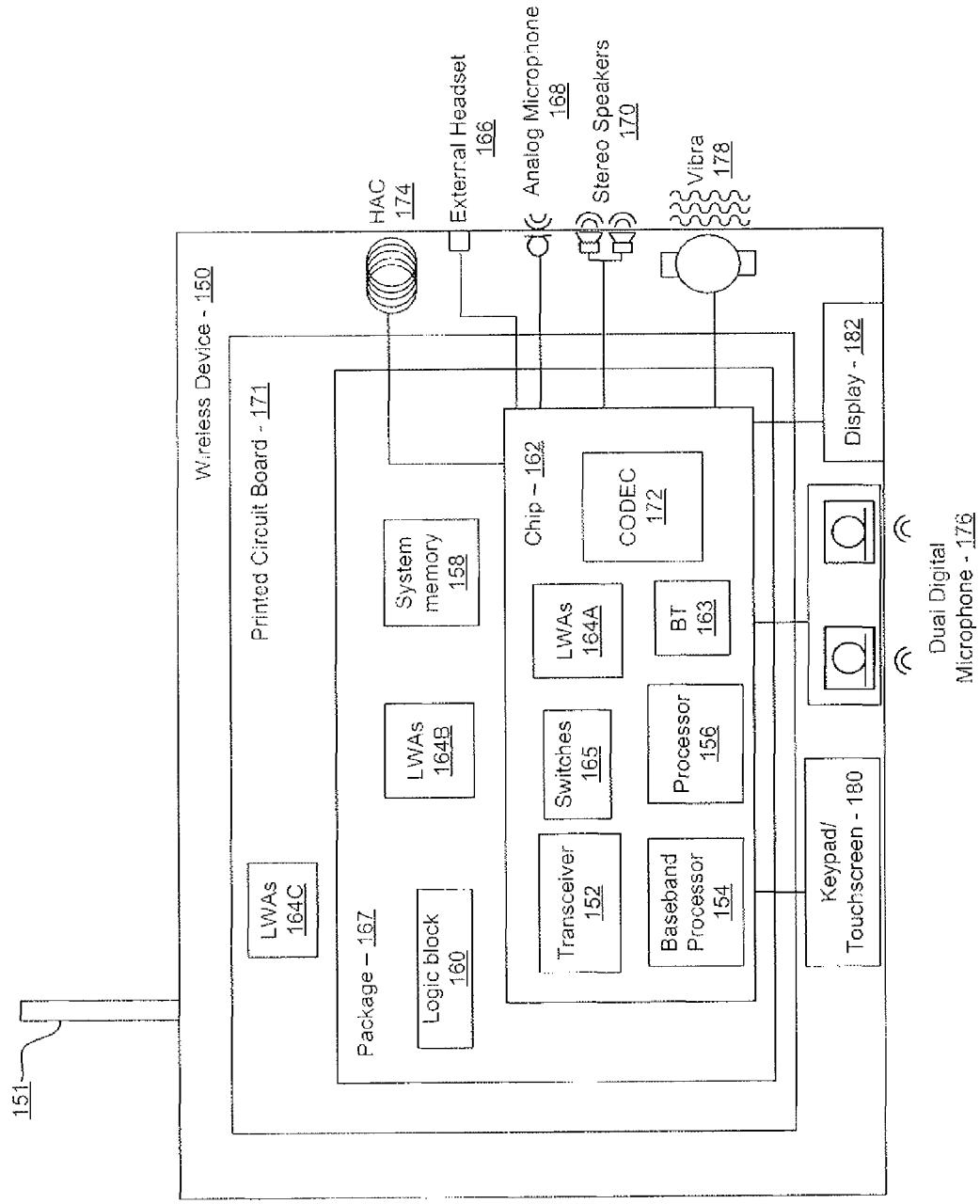
FIG. 1 is a block diagram of an exemplary wireless system with leaky wave antennas for dynamic range detection and positioning, which may be utilized in accordance with an embodiment of the invention.

FIG. 1 is a block diagram of an exemplary wireless system with leaky wave antennas for dynamic range detection and positioning, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, leaky wave antennas 164A-164C, switches 165, an external headset port 166, and an integrated circuit package 167. The wireless device 150 may also comprise an analog microphone 168, integrated hands-free (IHF) stereo speakers 170, a printed circuit board 171, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the leaky wave antennas 164A-164C. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZigBee, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example.

The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The chip 162 may comprise an integrated circuit with multiple functional blocks integrated within, such as the transceiver 152, the processor 156, the baseband processor 154, the BT radio/processor 163, the leaky wave antennas 164A, and the CODEC 172. The number of functional blocks integrated in the chip 162 is not limited to the number shown in FIG. 1. Accordingly, any number of blocks may be integrated on the chip 162 depending on chip space and wireless device 150 requirements, for example. The chip 162 may be flip-chip bonded, for example, to the package 167, as described further with respect to FIG. 8.

The leaky wave antennas 164A-164C may comprise a resonant cavity with a highly reflective surface and a lower reflectivity surface, and may be integrated in and/or on the chip 162, the package 167, and or the printed circuit board 171. The lower reflectivity surface may allow the resonant mode to "leak" out of the cavity. The lower reflectivity surface of the leaky wave antennas 164A-164C may be configured with slots in a metal surface, or a pattern of metal patches, as described further in FIGS. 2 and 3. The physical dimensions of the leaky wave antennas 164A-164C may be configured to optimize bandwidth of transmission and/or the beam pattern radiated or received. By integrating the leaky wave antennas 164A-164C on the package 167 and/or the printed circuit board 171, the dimensions of the leaky wave antennas 164A-164C may not be limited by the size of the chip 162.

In an exemplary embodiment of the invention, the leaky wave antennas 164A-164C may be operable to determine the position and distance of an object from the wireless device. Accordingly, the leaky wave antennas 164A-164C may be operable to transmit RF signals toward an object and determine the distance from the wireless device based on the time to reflect the signal. In addition, the Doppler shift of the reflected signal may be utilized to determine a velocity of the object.

Figure 3:
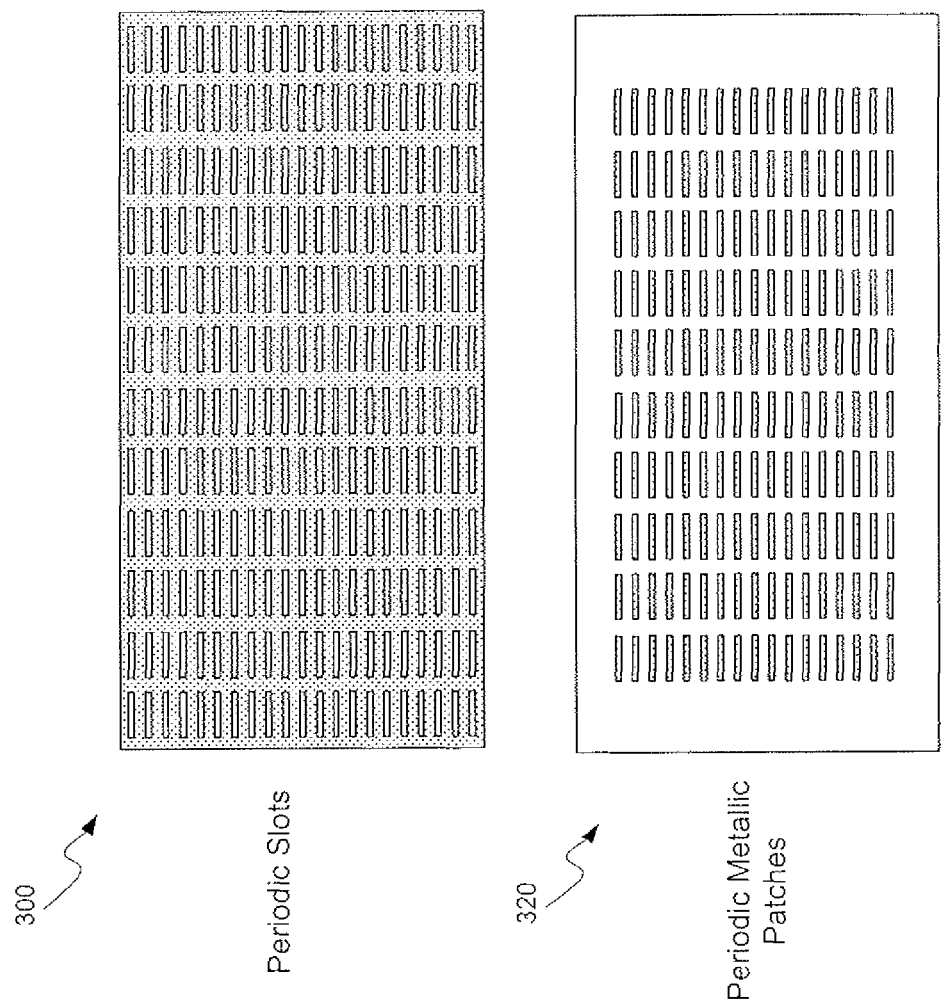
FIG. 3 is a block diagram illustrating a plan view of exemplary partially reflective surfaces, in accordance with an embodiment of the invention.

The switches 165 may comprise switches such as CMOS or MEMS switches that may be operable to switch different antennas of the leaky wave antennas 164A-164C to the transceiver 152 and/or switch elements in and/or out of the leaky wave antennas 164A-164C, such as the patches and slots described in FIG. 3. The switches 165 may enable the coupling of PA's to different feed points on the leaky wave antennas 164A-164C, depending on the desired impedance seen at the feed point, or to different antennas to optimize resolution of channel scanning, such as by coupling to the antennas separated by the largest distance in the desired scanning axis.

The external headset port 166 may comprise a physical connection for an external headset to be communicatively coupled to the wireless device 150. The analog microphone 168 may comprise suitable circuitry, logic, interface(s), and/or code that may detect sound waves and convert them to electrical signals via a piezoelectric effect, for example. The electrical signals generated by the analog microphone 168 may comprise analog signals that may require analog to digital conversion before processing.

The package 167 may comprise a ceramic package, a printed circuit board, or other support structure for the chip 162 and other components of the wireless device 150. In this regard, the chip 162 may be bonded to the package 167. The package 167 may comprise insulating and conductive material, for example, and may provide isolation between electrical components mounted on the package 167.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The leaky wave antennas 164A-164C may be operable to transmit and/or receive wireless signals. In an exemplary embodiment of the invention, the leaky wave antennas may be situated along two or more axes such that when the frequency of transmission or reception is swept across the resonant frequency of the leaky wave antennas, the angle of the beam transmitted or reflected is swept along these axes.

In addition, the frequency of the transmission and/or reception may be determined by the cavity height of the leaky wave antennas 164A-164C. Accordingly, the reflective surfaces may be integrated at different heights or lateral spacing in the chip 162, the package 167, and/or the printed circuit board 171, thereby configuring leaky wave antennas with different resonant frequencies.

In an exemplary embodiment of the invention, the resonant cavity frequency of the leaky wave antennas 164A-164C may be configured by tuning the cavity height using MEMS actuation. Accordingly, a bias voltage may be applied such that one or both of the reflective surfaces of the leaky wave antennas 164A-164C may be deflected by the applied potential. In this manner, the cavity height, and thus the resonant frequency of the cavity, may be configured. Similarly, the patterns of slots and/or patches in the partially reflected surface may be configured by the switches 165.

Different frequency signals may be transmitted and/or received by the leaky wave antennas 164A-164C by selectively coupling the transceiver 152 to leaky wave antennas with different cavity heights. For example, leaky wave antennas with reflective surfaces on the top and the bottom of the package 167 may have the largest cavity height, and thus provide the lowest resonant frequency. Conversely, leaky wave antennas with a reflective surface on the surface of the package 167 and another reflective surface just below the surface of the package 167, may provide a higher resonant frequency. The selective coupling may be enabled by the switches 165 and/or CMOS devices in the chip 162.

In an exemplary embodiment of the invention, the leaky wave antennas 164A-164C may be configured to sweep the angle of transmission of RF signals by sweeping the frequency of the feed signal across the resonant frequency of the leaky wave antennas. The leaky wave antennas 164A-164C may then be configured to sweep the angle of reception of RF signals while monitoring the RF signal strength at each of the leaky wave antennas 164A-164C. In this manner, the leaky wave antennas 164A-164C may be operable to determine the position and distance of an object from the wireless device 150. Accordingly, the leaky wave antennas 164A-164C may be operable to transmit RF signals toward an object and determine the distance from the wireless device 150 based on the time to reflect the signal. In addition, the Doppler shift of the reflected signal may be utilized to determine a velocity of the object.

The determination of the velocity of the object may be achieved by determining the Doppler shift of the reflected signal from a fixed frequency transmitted signal. Similarly, a fixed frequency measurement of time between the transmission of a signal and receiving of the reflected signal may be utilized. In another exemplary embodiment, the distance of a fixed object may be determined by transmitting a chirped signal or chirp, with the reflected signal being utilized to accurately determine the position of the object. In this manner, a two-step process may be utilized to accurately determine the range and velocity of an object.

Figure 2:
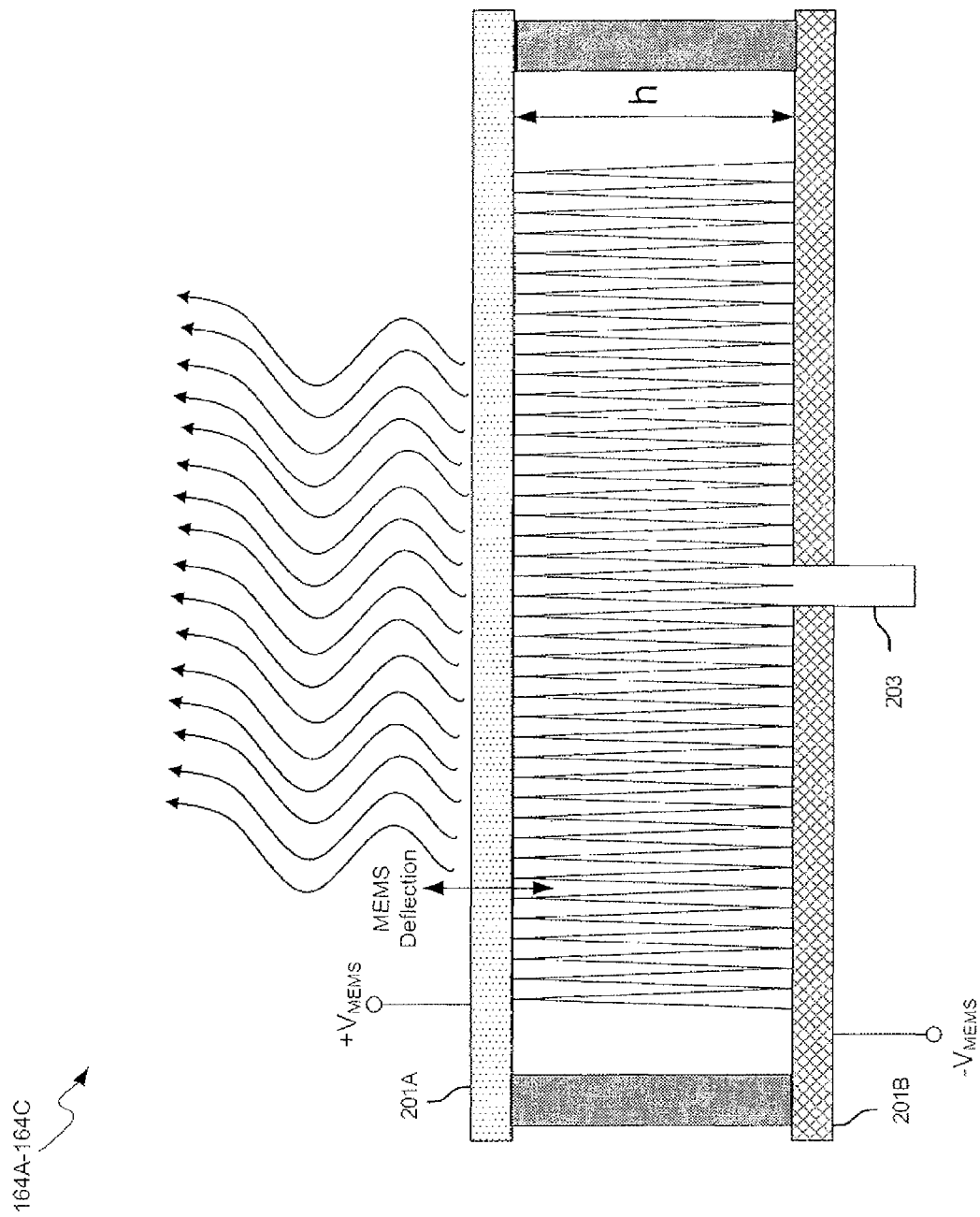
FIG. 2 is a block diagram illustrating an exemplary leaky wave antenna, in accordance with an embodiment of the invention.

FIG. 2 is a block diagram illustrating an exemplary leaky wave antenna, in accordance with an embodiment of the invention. Referring to FIG. 2, there is shown the leaky wave antennas 164A-164C comprising a partially reflective surface 201A, a reflective surface 201B, and a feed point 203. The space between the partially reflective surface 201A and the reflective surface 201B may be filled with dielectric material, for example, and the height, h, between the partially reflective surface 201A and the reflective surface 201B may be utilized to configure the frequency of transmission of the leaky wave antennas 164A-164C. In another embodiment of the invention, an air gap may be integrated in the space between the partially reflective surface 201A and the reflective surface 201B to enable MEMS actuation. There is also shown (microelectromechanical systems) MEMS bias voltages, $+V_{MEMS}$ and $-V_{MEMS}$.

The feed point 203 may comprise an input terminal for applying an input voltage to or receiving an output voltage from the leaky wave antennas 164A-164C. The invention is not limited to a single feed point 203, as there may be any amount of feed points for different phases of signal or a plurality of signal sources, for example, to be applied to and/or received from the leaky wave antennas 164A-164C.

In an exemplary embodiment of the invention, the height, h, may be one-half the wavelength of the desired transmitted mode from the leaky wave antennas 164A-164C. In this manner, the phase of an electromagnetic mode that traverses the cavity twice may be coherent with the input signal at the feed point 203, thereby configuring a resonant cavity known as a Fabry-Perot cavity. The magnitude of the resonant mode may decay exponentially in the lateral direction from the feed point 203, thereby reducing or eliminating the need for confinement structures to the sides of the leaky wave antennas 164A-164C. The input impedance of the leaky wave antennas 164A-164C may be configured by the vertical placement of the feed point 203, as described further in FIG. 6.

In operation, a signal to be transmitted via a power amplifier in the transceiver 152 may be communicated to the feed point 203 of the leaky wave antennas 164A-164C with a frequency f, or a signal to be received by the leaky wave antennas 164A-164C may be directed at the antenna. The cavity height, h, may be configured to correlate to one half the wavelength of a harmonic of the signal of frequency f. The signal may traverse the height of the cavity and may be reflected by the partially reflective surface 201A, and then traverse the height back to the reflective surface 201B. Since the wave will have travelled a distance corresponding to a full wavelength, constructive interference may result and a resonant mode may thereby be established.

Leaky wave antennas may enable the configuration of high gain antennas without the need for a large array of antennas which require a complex feed network and suffer from loss due to feed lines. The leaky wave antennas 164A-164C may be operable to transmit and/or receive wireless signals via conductive layers in and/or on the package 167 and/or the printed circuit board 171. In this manner, the resonant frequency of the cavity may cover a wider range due to the larger size of the package 167 and the printed circuit board 171, compared to the chip 162, without requiring large areas needed for conventional antennas and associated circuitry. In addition, by integrating leaky wave antennas in a plurality of packages on one or more printed circuit boards, wireless communication between packages may be enabled.

In an exemplary embodiment of the invention, the frequency of transmission and/or reception of the leaky wave antennas 164A-164C may be configured by selecting one of the leaky wave antennas 164A-164C with the appropriate cavity height for the desired frequency. The angle of transmission may be configured by tuning the frequency of a signal communicated to the feed point 203. Similarly, the angle of reception of signals received from the leaky wave antenna may be configured by tuning the frequency of the signal received from the feed point 203, such as by filtering out other frequencies at the feed point 203.

In another embodiment of the invention, the cavity height, h, may be configured by MEMS actuation. For example, the bias voltages $+V_{MEMS}$ and $-V_{MEMS}$ may deflect one or both of the reflective surfaces 201A and 201B compared to zero bias, thereby configuring the resonant frequency of the cavity.

The leaky wave antennas 164A-164C may be operable to determine the position and distance of an object from the wireless device 150. Accordingly, the leaky wave antennas 164A-164C may be operable to transmit RF signals toward an object and determine the distance from the wireless device 150 as well as velocity based on the reflected the signal. The determination of the velocity of the object may be achieved by determining the Doppler shift of the reflected signal from a fixed frequency transmitted signal. Similarly, a fixed frequency measurement of time between the transmission of a signal and receiving of the reflected signal may be utilized. In another exemplary embodiment, the distance of a fixed object may be determined by transmitting a chirped signal or chirp, with the reflected signal being utilized to accurately determine the position of the object. In this manner, a two-step process may be utilized to accurately determine the range and velocity of an object.

FIG. 3 is a block diagram illustrating a plan view of exemplary partially reflective surfaces, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas.

In an embodiment of the invention, the slots/patches may be configured via CMOS and/or micro-electromechanical system (MEMS) switches, such as the switches 165 described with respect to FIG. 1, to tune the Q of the resonant cavity. The slots and/or patches may be configured in conductive layers in and/or on the package 167 and may be shorted together or switched open utilizing the switches 165. In this manner, RF signals, such as 60 GHz signals, for example, may be transmitted from various locations without the need for additional circuitry and conventional antennas with their associated circuitry that require valuable chip space.

In another embodiment of the invention, the slots or patches may be configured in conductive layers in a vertical plane of the chip 162, the package 167, and/or the printed circuit board 171, thereby enabling the communication of wireless signals in a horizontal direction in the structure.

In another exemplary embodiment of the invention, the partially reflective surfaces 300/320 may be integrated in and/or on the package 167. In this manner, different frequency signals may be transmitted and/or received. Accordingly, a partially reflective surface 300/320 integrated within the package 167 and a reflective surface 201B may transmit and/or receive signals at a higher frequency signal than from a resonant cavity defined by a partially reflective surface 300/320 on surface of the package 167 and a reflective surface 201B on the other surface of the package 167.

Figure 4:
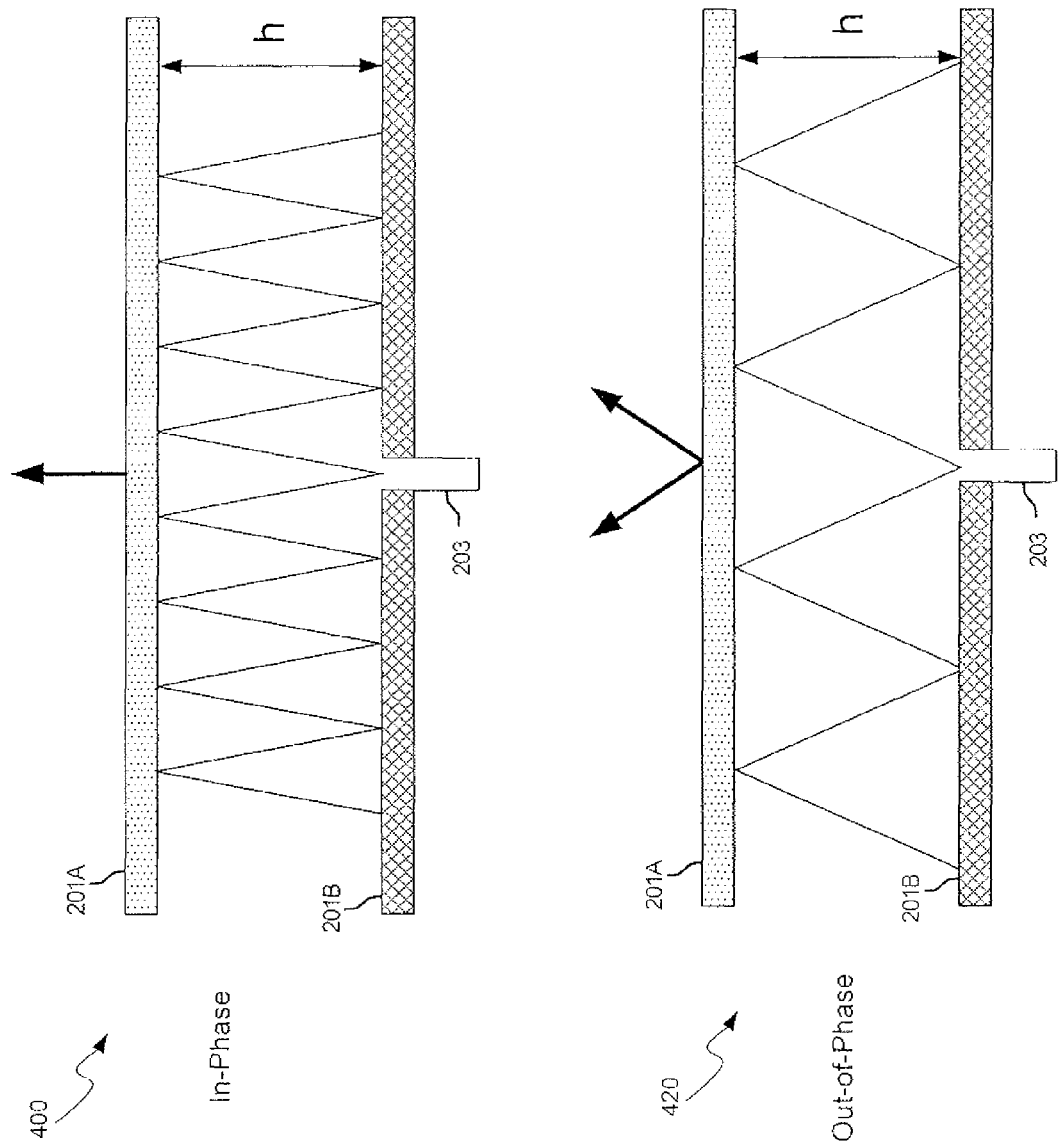
FIG. 4 is a block diagram illustrating an exemplary phase dependence of a leaky wave antenna, in accordance with an embodiment of the invention.

FIG. 4 is a block diagram illustrating an exemplary phase dependence of a leaky wave antenna, in accordance with an embodiment of the invention. Referring to FIG. 4, there is shown a leaky wave antenna comprising the partially reflective surface 201A, the reflective surface 201B, and the feed point 203. In-phase condition 400 illustrates the relative beam shape transmitted by the leaky wave antennas 164A-164C when the frequency of the signal communicated to the feed point 203 matches that of the resonant cavity as defined by the cavity height, h, and the dielectric constant of the material between the reflective surfaces.

Similarly, out-of-phase condition 420 illustrates the relative beam shape transmitted by the leaky wave antennas 164A-164C when the frequency of the signal communicated to the feed point 203 does not match that of the resonant cavity. The resulting beam shape may be conical, as opposed to a single main vertical node. These are illustrated further with respect to FIG. 5. The leaky wave antennas 164A-164C may be integrated at various heights in the chip 162, the package 167, and/or the printed circuit board 171, thereby providing a plurality of transmission and reception sites with varying resonant frequency.

By configuring the leaky wave antennas for in-phase and out-of-phase conditions, signals possessing different characteristics may be directed out of and/or into the chip 162, the package 167, and/or the printed circuit board 171 in desired directions, thereby enabling wireless communication between a plurality of devices and directions. In an exemplary embodiment of the invention, the angle at which signals may be transmitted by a leaky wave antenna may be dynamically controlled so that the transmitted signals may be directed in a desired direction for dynamic range detection and positioning of objects, for example. In another embodiment of the invention, the leaky wave antennas 164A-164C may be operable to receive reflected RF signals, such as 60 GHz signals, for example. The direction of received signals may be configured by the in-phase and out-of-phase conditions.

Similarly, by utilizing a plurality of leaky wave antennas to transmit a signal, the reflected signal may be utilized to determine range and velocity of the object. The determination of the velocity of the object may be achieved by determining the Doppler shift of the reflected signal from a fixed frequency transmitted signal. Similarly, a fixed frequency measurement of time between the transmission of a signal and receiving of the reflected signal may be utilized. In another exemplary embodiment, the distance of a fixed object may be determined by transmitting a chirped signal or chirp, with the reflected signal being utilized to accurately determine the position of the object. In this manner, a two-step process may be utilized to accurately determine the range and velocity of an object. For example, leaky wave antennas may be located on perpendicular axes, such that two antennas on a single axis can sweep transmission and reception angle of RF signals along that axis, and antennas along a perpendicular axis may be operable to sweep transmission and reception along that axis. Thus, the range and location of an object may be tracked across an entire field-of-view of the plurality of leaky wave antennas.

Figure 5A:
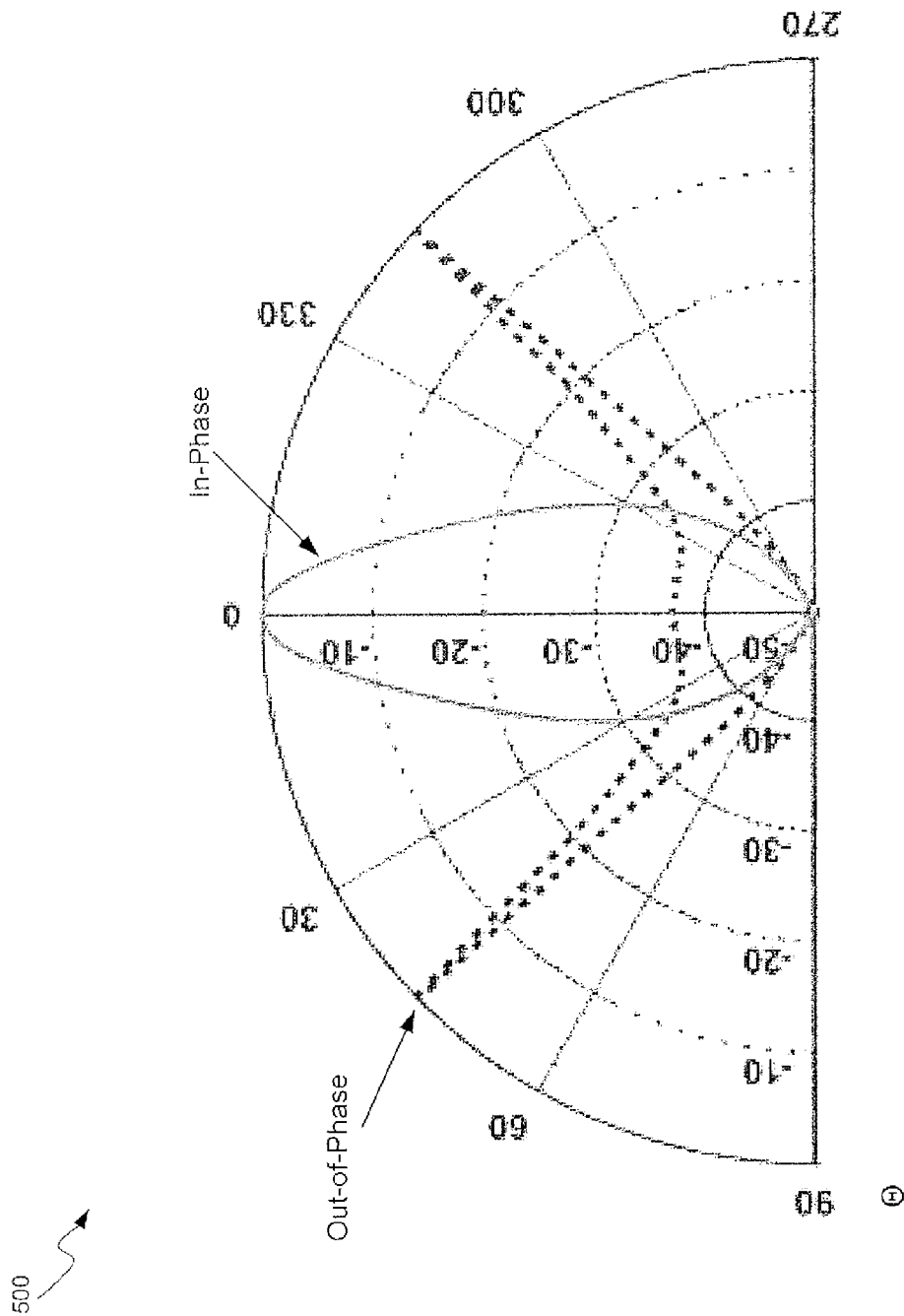
FIG. 5A is a block diagram illustrating exemplary in-phase and out-of-phase beam shapes for a leaky wave antenna, in accordance with an embodiment of the invention.

FIG. 5A is a block diagram illustrating exemplary in-phase and out-of-phase beam shapes for a leaky wave antenna, in accordance with an embodiment of the invention. Referring to FIG. 5A, there is shown a plot 500 of transmitted signal beam shape versus angle, $\Theta$, for the in-phase and out-of-phase conditions for a leaky wave antenna.

The In-phase curve in the plot 500 may correlate to the case where the frequency of the signal communicated to a leaky wave antenna matches the resonant frequency of the cavity. In this manner, a single vertical main node may result. In instances where the frequency of the signal at the feed point is not at the resonant frequency, a double, or conical-shaped node may be generated as shown by the Out-of-phase curve in the plot 500. By configuring the leaky wave antennas for in-phase and out-of-phase conditions, signals may be directed out of or into the chip 162, package 167, and/or the printed circuit board 171 in desired directions.

Figure 5B:
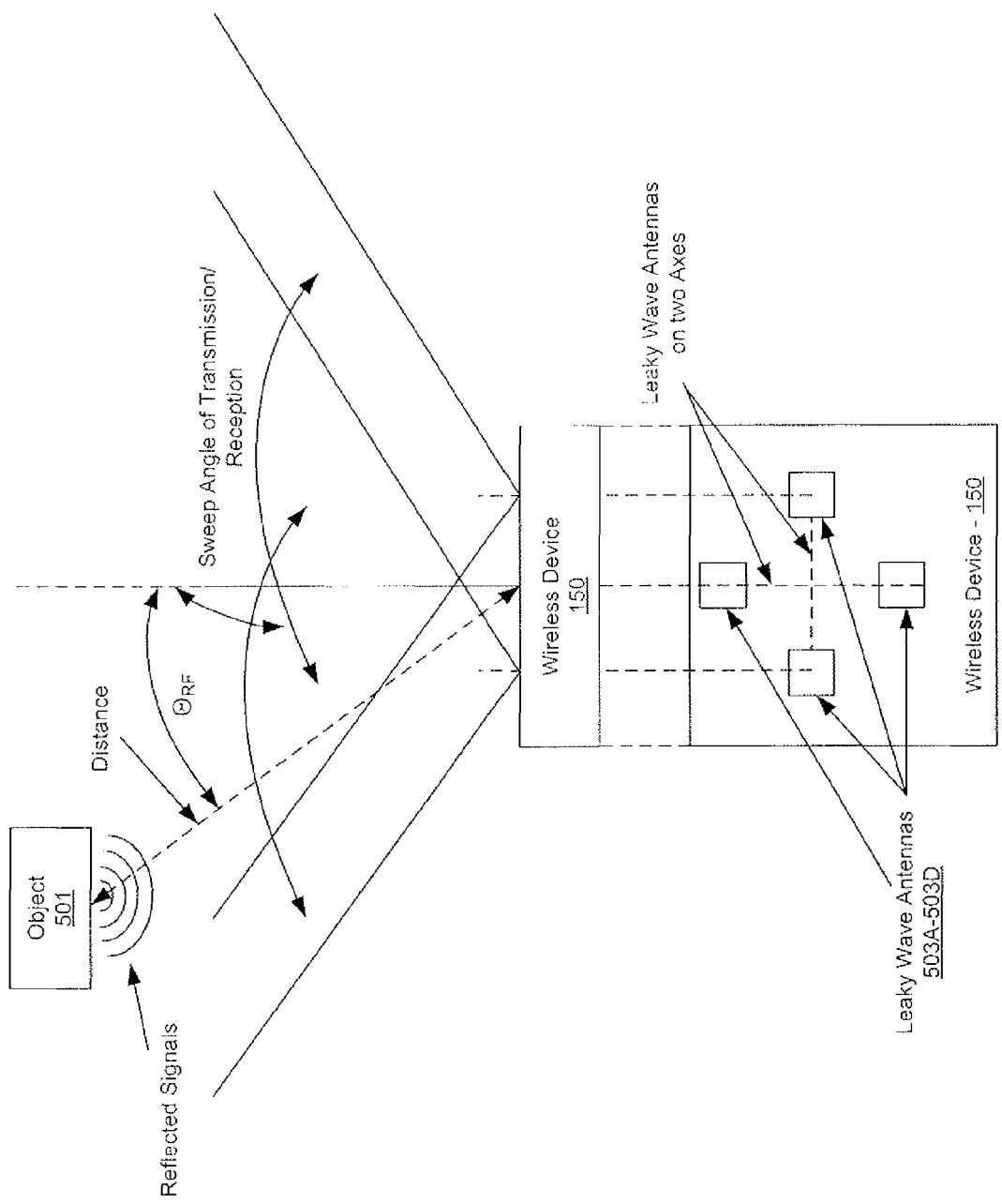
FIG. 5B is a block diagram illustrating dynamic range detection and positioning utilizing leaky wave antennas, in accordance with an embodiment of the invention.

FIG. 5B is a block diagram illustrating dynamic range detection and positioning utilizing leaky wave antennas, in accordance with an embodiment of the invention. Referring to FIG. 5B, there is shown the wireless device 150, an object 501, and leaky wave antennas 503A-503D. The wireless device 150 is as described with respect to FIG. 1, and is shown in two views in FIG. 5B to illustrate an exemplary arrangement of leaky wave antennas on two perpendicular axes and how the transmitted and/or receive beams may be scanned.

The object 501 may comprise an object that reflects RF signals. The leaky wave antennas 503A-503D may be substantially similar to the leaky wave antennas 164A-164D and may be integrated in the chip 162, the package 167, and/or the printed circuit board 171, for example. The leaky wave antennas 503A-503D may be operable to scan the angle of transmission and/or reception of RF signals by tuning the frequency of signals communicated to or received from the feed points of the antennas.

In operation, the wireless device 150 may be operable to determine the range, position, and/or velocity of objects by transmitting RF signals and receiving the reflected signals. Accordingly, the wireless device 150 may be operable to scan the transmitted frequency of the leaky wave antennas 503A-503D. The reflected signals may then be measured to determine a time of travel and/or a Doppler shift that may result where the object 501 is moving with respect to the wireless device 150. The determination of the velocity of the object may be achieved by determining the Doppler shift of the reflected signal from a fixed frequency transmitted signal. Similarly, a fixed frequency measurement of time between the transmission of a signal and receiving of the reflected signal may be utilized. In another exemplary embodiment, the distance of a fixed object may be determined by transmitting a chirped signal or chirp, with the reflected signal being utilized to accurately determine the position of the object. In this manner, a two-step process may be utilized to accurately determine the range and velocity of an object.

By scanning a plurality of leaky wave antennas on perpendicular axes and monitoring the received signals, a range, location, and/or velocity of an object 501 may be determined. The measured signal strengths may be utilized to triangulate the location of the moving object 501. The transmit/receive angle sweep may be repeated on a periodic or aperiodic basis.

A constant frequency may be transmitted and the reflected RF signal may be measured for a Doppler shift indicating relative velocity with respect to the wireless devices. In addition, a chirped signal may be transmitted by the leaky wave antennas 164A-164D for accurate measurement of distance between the object 501 and the wireless device 150. The frequency shift in the chirping may not be significant enough to change the angle of transmission significantly. In another exemplary embodiment of the invention, the angle of transmission/reception of the leaky wave antennas 503A-503D may be configured by MEMS actuation of one or more reflective surfaces in the antennas. In this manner, the resonant frequency may be tuned by MEMS actuation at the same time as the chirp, thereby compensating for any change in the angle of transmission/reception.

Figure 6:
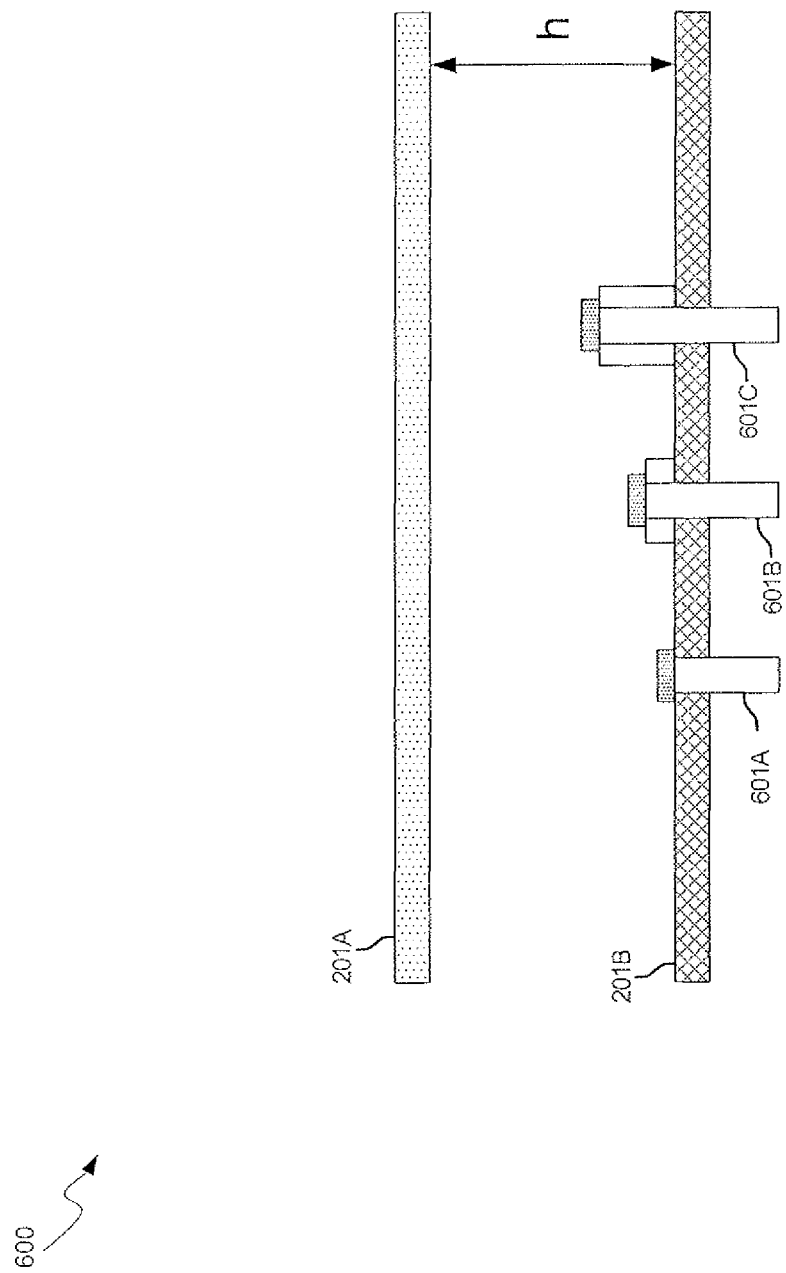
FIG. 6 is a block diagram illustrating a leaky wave antenna with variable input impedance feed points, in accordance with an embodiment of the invention.

FIG. 6 is a block diagram illustrating a leaky wave antenna with variable input impedance feed points, in accordance with an embodiment of the invention. Referring to FIG. 6, there is shown a leaky wave antenna 600 comprising the partially reflective surface 201A and the reflective surface 201B. There is also shown feed points 601A-601C. The feed points 601A-601C may be located at different positions along the height, h, of the cavity thereby configuring different impedance points for the leaky wave antenna.

In this manner, a leaky wave antenna may be utilized to couple to a plurality of power amplifiers, or a configurable power amplifier with varying output impedances. For example, in instances where a power amplifier is operated in a high gain, low output impedance configuration, it may be coupled to a low impedance feed point, such as the feed point 601A.

Similarly, by integrating leaky wave antennas in conductive layers in the chip 162, the package 167, and/or the printed circuit board 171, the impedance of the leaky wave antenna may be matched to the power amplifier without impedance variations that may result with conventional antennas and their proximity or distance to associated driver electronics. In addition, by integrating reflective and partially reflective surfaces with varying cavity heights and varying feed points, leaky wave antennas with both different impedances and resonant frequencies may be enabled. In an embodiment of the invention, the heights of the feed points 601A-601C may be configured by MEMS actuation.

Figure 7:
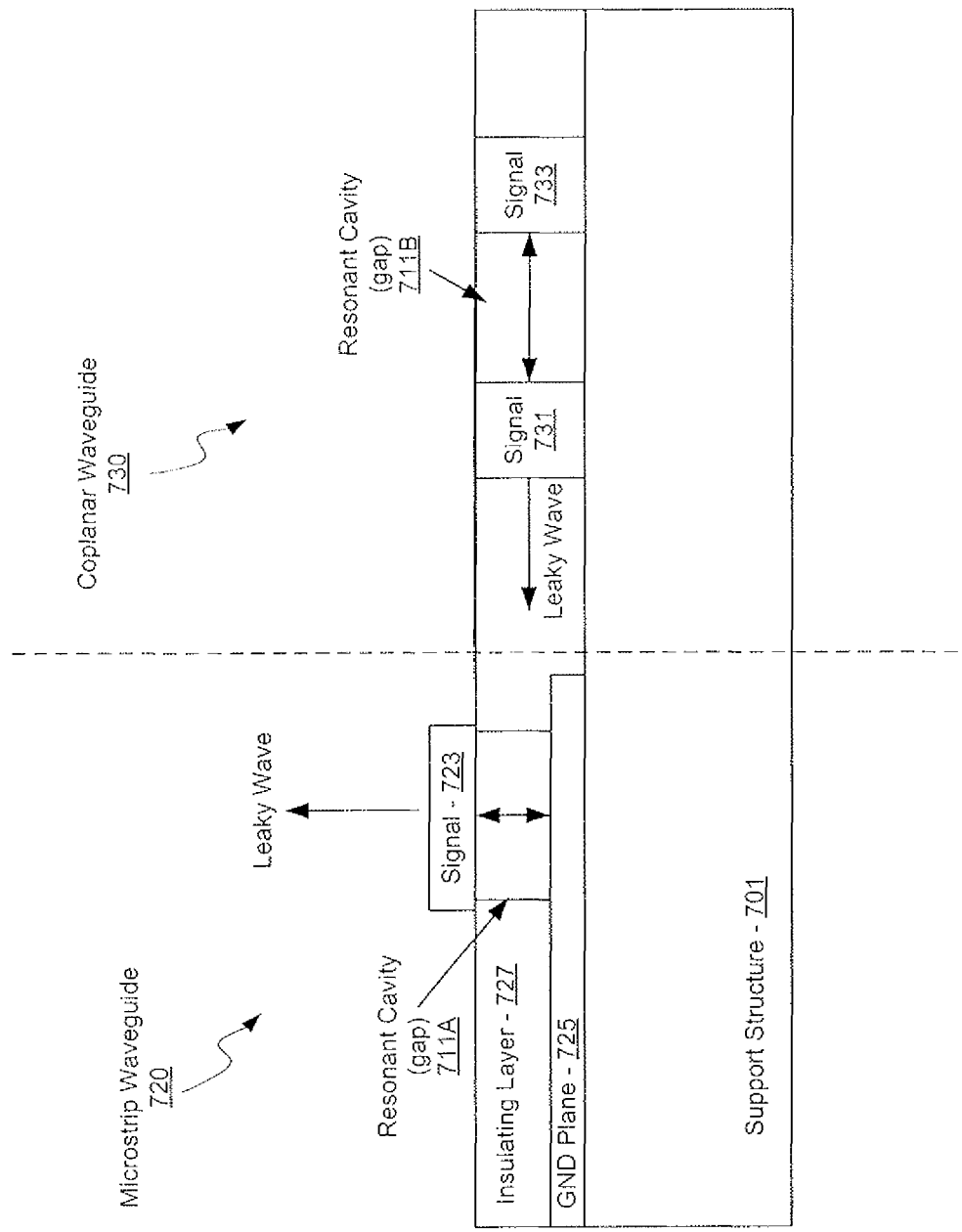
FIG. 7 is a block diagram illustrating a cross-sectional view of coplanar and microstrip waveguides, in accordance with an embodiment of the invention.

FIG. 7 is a block diagram illustrating a cross-sectional view of coplanar and microstrip waveguides, in accordance with an embodiment of the invention. Referring to FIG. 7, there is shown a microstrip waveguide 720, a coplanar waveguide 730, and a support structure 701. The microstrip waveguide 720 may comprise signal conductive lines 723, a ground plane 725, a resonant cavity 711A, and an insulating layer 727. The coplanar waveguide 730 may comprise signal conductive lines 731 and 733, a resonant cavity 711B, the insulating layer 727, and a multi-layer support structure 701. The support structure 701 may comprise the chip 162, the package 167, and/or the printed circuit board 171, for example.

The signal conductive lines 723, 731, and 733 may comprise metal traces or layers deposited in and/or on the insulating layer 727. In another embodiment of the invention, the signal conductive lines 723, 731, and 733 may comprise poly-silicon or other conductive material. The separation and the voltage potential between the signal conductive line 723 and the ground plane 725 may determine the electric field generated therein. In addition, the dielectric constant of the insulating layer 727 may also determine the electric field between the signal conductive line 723 and the ground plane 725.

The resonant cavities 711A and 711B may comprise the insulating layer 727, an air gap, or a combination of an air gap and the insulating layer 727, thereby enabling MEMS actuation and thus frequency tuning.

The insulating layer 727 may comprise $SiO_2$ or other insulating material that may provide a high resistance layer between the signal conductive line 723 and the ground plane 725, and the signal conductive lines 731 and 733. In addition, the electric field between the signal conductive line 723 and the ground plane 725 may be dependent on the dielectric constant of the insulating layer 727.

The thickness and the dielectric constant of the insulating layer 727 may determine the electric field strength generated by the applied signal. The resonant cavity thickness of a leaky wave antenna may be dependent on the spacing between the signal conductive line 723 and the ground plane 725, or the signal conductive lines 731 and 733, for example.

The signal conductive lines 731 and 733, and the signal conductive line 723 and the ground plane 725 may define resonant cavities for leaky wave antennas. Each layer may comprise a reflective surface or a partially reflective surface depending on the pattern of conductive material. For example, a partially reflective surface may be configured by alternating conductive and insulating material in a desired pattern. In this manner, signals may be directed out of, or received into, a surface of the chip 162, the package 167, and/or the printed circuit board 171, as illustrated with the microstrip waveguide 720. In another embodiment of the invention, signals may be communicated in the horizontal plane of the chip 162, the package 167, and/or the printed circuit board 171 utilizing the coplanar waveguide 730.

The support structure 701 may provide mechanical support for the microstrip waveguide 720, the coplanar waveguide 730, and other devices that may be integrated within. In another embodiment of the invention, the chip 162, the package 167, and/or the printed circuit board 171 may comprise Si, GaAs, sapphire, InP, GaO, ZnO, CdTe, CdZnTe, ceramics, polytetrafluoroethylene, and/or $Al_2O_3$, for example, or any other substrate material that may be suitable for integrating microstrip structures.

In operation, a bias and/or a signal voltage may be applied across the signal conductive line 723 and the ground plane 725, and/or the signal conductive lines 731 and 733 to transmit RF signals. Similarly, a voltage may be measured across the signal conductive line 723 and the ground plane 725, and/or the signal conductive lines 731 and 733, to measure received RF signals. The thickness of a leaky wave antenna resonant cavity may be dependent on the distance between the conductive lines in the microstrip waveguide 720 and/or the coplanar transmission waveguide 730.

By alternating patches of conductive material with insulating material, or slots of conductive material in dielectric material, a partially reflective surface may result, which may allow a signal to "leak out" in that direction, as shown by the Leaky Wave arrows in FIG. 7. In this manner, wireless signals may be directed in to or out of the surface plane of the support structure 710, or parallel to the surface of the support structure 710.

Similarly, by sequentially placing the conductive signal lines 731 and 733 with different spacing, different cavity heights may result, and thus different resonant frequencies, thereby forming a distributed leaky wave antenna. In this manner, a plurality of signals at different frequencies may be transmitted from, or received by, the distributed leaky wave antenna.

By integrating the conductive signal lines 731 and 733 and the ground plane 725 in the package 167, wireless signals may be received by the package 167. Wireless signals may be communicated between packages in the horizontal or vertical planes depending on which type of leaky wave antenna is enabled, such as a coplanar or microstrip structure. Feed points may be integrated at different heights or lateral distances within the resonant cavity gaps 711A and 711B, respectively, thereby resulting in different impedances. The different impedance feed points may be coupled to a PA depending on the output impedance of the PA in a given output power configuration.

In an exemplary embodiment of the invention, a plurality of leaky wave antennas may be integrated in the support structure 701 in an arrangement that enables scanning of transmission and/or reception in two or more axes. By scanning a plurality of leaky wave antennas on perpendicular axes and monitoring the received signals, a range, location, and/or velocity of an object may be determined. A constant frequency may be transmitted and the reflected RF signal may be measured for a Doppler shift indicating relative velocity with respect to the wireless devices. In addition, a chirped signal may be transmitted by the leaky wave antennas for accurate measurement of distance between the object and the wireless device 150. The frequency shift in the chirping may not be significant enough to change the angle of transmission significantly. In another exemplary embodiment of the invention, the angle of transmission/reception of the leaky wave antennas may be configured by MEMS actuation of one or more reflective surfaces in the antennas thereby tuning the height of the resonant cavities 711A and 711B. In this manner, the resonant frequency may be tuned by MEMS actuation at the same time as the chirp, thereby compensating for any change in the angle of transmission/reception.

Figure 8:
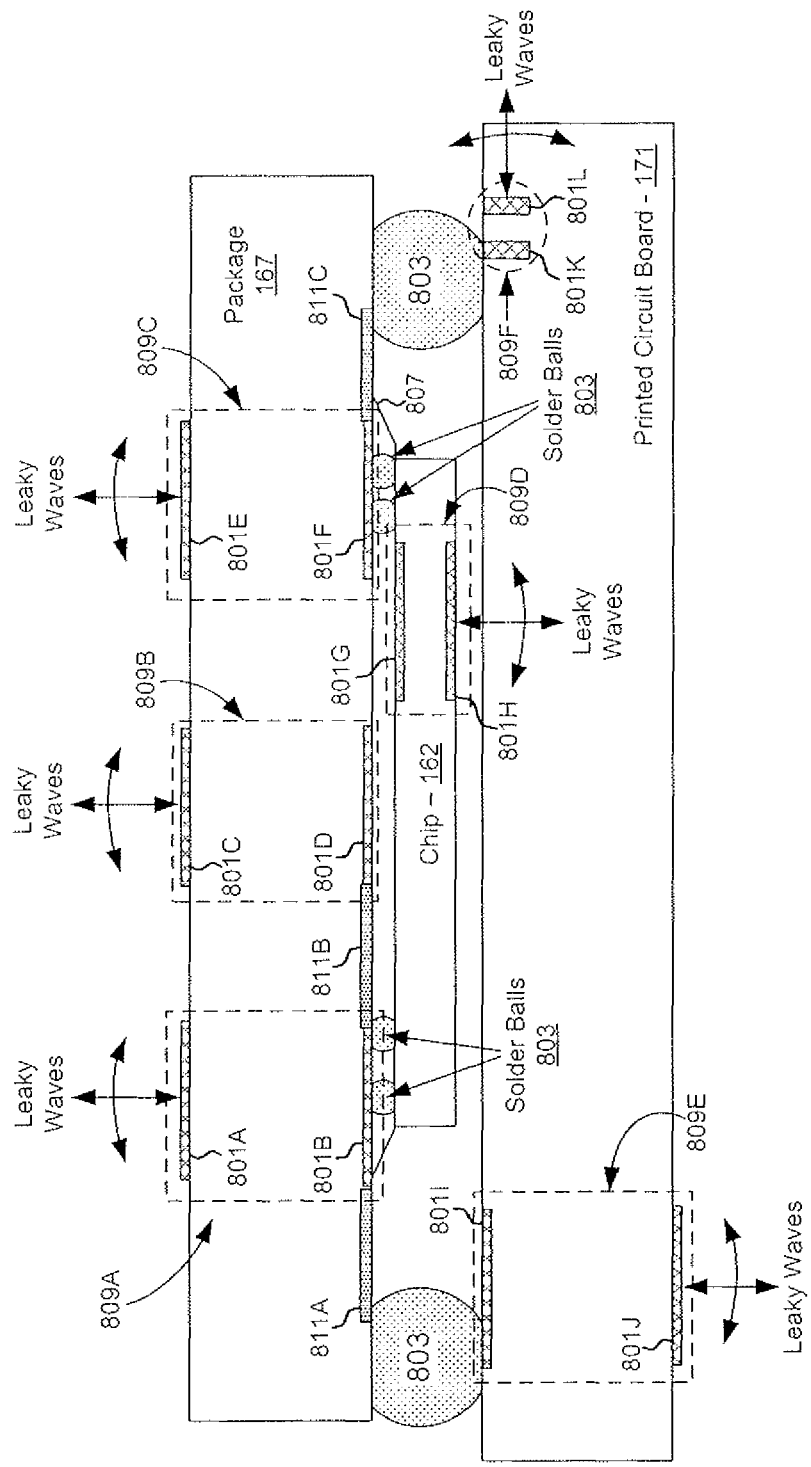
FIG. 8 is a diagram illustrating leaky wave antennas for dynamic range detection and positioning, in accordance with an embodiment of the invention.

FIG. 8 is a diagram illustrating leaky wave antennas for dynamic range detection and positioning, in accordance with an embodiment of the invention. Referring to FIG. 8, there is shown metal layers 801A-801L, solder balls 803, thermal epoxy 807, leaky wave antennas 809A-809F, and metal interconnects 811A-811C. The chip 162, the package 167, and the printed circuit board 171 may be as described previously.

The chip 162, or integrated circuit, may comprise one or more components and/or systems within the wireless system 150. The chip 162 may be bump-bonded or flip-chip bonded to the package 167 utilizing the solder balls 803. Similarly, the package 167 may be flip-chip bonded to the printed circuit board 171. In this manner, wire bonds connecting the chip 162 to the package 167 and the package 167 to the printed circuit board 171 may be eliminated, thereby reducing and/or eliminating uncontrollable stray inductances due to wire bonds, for example. In addition, the thermal conductance out of the chip 162 may be greatly improved utilizing the solder balls 803 and the thermal epoxy 807. The thermal epoxy 807 may be electrically insulating but thermally conductive to allow for thermal energy to be conducted out of the chip 162 to the much larger thermal mass of the package 167.

The metal layers 801A-801L and the metal interconnects 811A-811C may comprise deposited metal layers utilized to delineate and couple to leaky wave antennas in and/or on the chip 162, the package 167, and the printed circuit board 171. The leaky wave antennas 809A-809F may be utilized to scan for RF signal sources by scanning the angle of reception of the antennas. In addition, the leaky wave antenna 809F may comprise conductive and insulating layers integrated in and/or on the printed circuit board 171 extending into the cross-sectional view plane to enable communication of signals horizontally in the plane of the printed circuit board 171, as illustrated by the coplanar waveguide 730 described with respect to FIG. 7. This coplanar structure may also be utilized in the chip 162 and/or the package 167.

In an embodiment of the invention, the spacing between pairs of metal layers, for example 801A and 801B, 801C and 801D, 801E and 801F, and 801G and 801H, may define vertical resonant cavities of leaky wave antennas. In this regard, a partially reflective surface, as shown in FIGS. 2 and 3, for example, may enable the resonant electromagnetic mode in the cavity to leak out from that surface.

The metal layers 801A-801J comprising the leaky wave antennas 809A-809E may comprise microstrip structures as described with respect to FIG. 7. The region between the metal layers 801A-801L may comprise a resistive material that may provide electrical isolation between the metal layers 801A-801L thereby creating a resonant cavity. In an embodiment of the invention, the region between the metal layers 801A-801L may comprise air and/or a combination of air and dielectric material, thereby enabling MEMS actuation of the metal layers 801A-801L.

The number of metal layers or leaky wave antennas is not limited to the number of metal layers 801A-801L or leaky wave antennas 809A-809F shown in FIG. 8. Accordingly, there may be any number of layers embedded within and/or on the chip 162, the package 167, and/or the printed circuit board 171, depending on the number of leaky wave antennas, traces, waveguides and other devices fabricated.

The solder balls 803 may comprise spherical balls of metal to provide electrical, thermal and physical contact between the chip 162, the package 167, and/or the printed circuit board 171. In making the contact with the solder balls 803, the chip 162 and/or the package 167 may be pressed with enough force to squash the metal spheres somewhat, and may be performed at an elevated temperature to provide suitable electrical resistance and physical bond strength. The thermal epoxy 807 may fill the volume between the solder balls 803 and may provide a high thermal conductance path for heat transfer out of the chip 162.

In operation, the chip 162 may comprise an RF front end, such as the RF transceiver 152, described with respect to FIG. 1, and may be utilized to transmit and/or receive RF signals, at 60 GHz, for example. The chip 162 may be electrically coupled to the package 167. The package 167 may be electrically coupled to the printed circuit board 171. In instances where high frequency signals, 60 GHz or greater, for example, may be communicated, leaky wave antennas in the chip 162, the package 167, and/or the printed circuit board 171 may be utilized to transmit signals to external devices.

Lower frequency signals may be communicated via leaky wave antennas with larger resonant cavity heights, such as the leaky wave antenna 809E integrated in the printed circuit board 171. However, higher frequency signal signals may also be communicated from leaky wave antennas integrated in the printed circuit board 171 by utilizing coplanar waveguide leaky wave antennas, such as the leaky wave antenna 809F, or by utilizing microstrip waveguide leaky wave antennas with lower cavity heights, such as the leaky wave antennas 809D.

The leaky wave antenna 809F may comprise a coplanar waveguide structure, and may be operable to communicate wireless signals in the horizontal plane, parallel to the surface of the printed circuit board 171. In this manner, signals may be communicated between laterally situated structures without the need to run lossy electrical signal lines. Coplanar waveguides on thinner structures, such as the chip 162, may have electromagnetic field lines that extend into the substrate, which can cause excessive absorption in lower resistivity substrates, such as silicon. For this reason, microstrip waveguides with a large ground plane may be used with lossy substrates. However, coplanar structures can be used when a high resistivity substrate is utilized for the chip 162.

The leaky wave antennas 809A-809E may comprise microstrip waveguide structures, for example, that may be operable to wirelessly communicate signals perpendicular to the plane of the supporting structure, such as the chip 162, the package 167, and the printed circuit board 171. In this manner, wireless signals may be communicated between the chip 162, the package 167, and the printed circuit board 171, and also to devices external to the wireless device 150 in the vertical direction.

The integration of leaky wave antennas in the chip 162, the package 167, and the printed circuit board 171 may result in the reduction of stray impedances when compared to wire-bonded connections between structures as in conventional systems, particularly for higher frequencies, such as 60 GHz. In this manner, volume requirements may be reduced and performance may be improved due to lower losses and accurate control of impedances via switches in the chip 162 or on the package 167, for example.

In an exemplary embodiment of the invention, leaky wave antennas may be arranged along a plurality of axes, thereby enabling scanning a field-of-view for the leaky wave antennas. For example, the leaky wave antennas 809A-809C may be situated along one axes, with the leaky wave antenna 809B plus one or more leaky wave antennas along the axis into the plane of the drawing defining the perpendicular axis.

An object may be located by scanning the transmitted signals of the leaky wave antennas 809A-809C and those in the axis into the plane of the figure, on perpendicular axes and monitoring the reflected signals. In instances where a constant frequency is transmitted, the reflected RF signal may be measured for a Doppler shift indicating relative velocity with respect to the wireless device. In addition, a chirped signal may be transmitted by the leaky wave antennas for accurate measurement of distance between the object and the wireless device 150. The frequency shift in the chirping may not be significant enough to significantly change the angle of transmission. In another exemplary embodiment of the invention, the angle of transmission/reception of the leaky wave antennas may be configured by MEMS actuation of one or more reflective surfaces in the antennas thereby tuning the height of the resonant cavities 711A and 711B. In this manner, the resonant frequency may be tuned by MEMS actuation at the same time as the chirp, thereby compensating for any change in the angle of transmission/reception.

Figure 9:
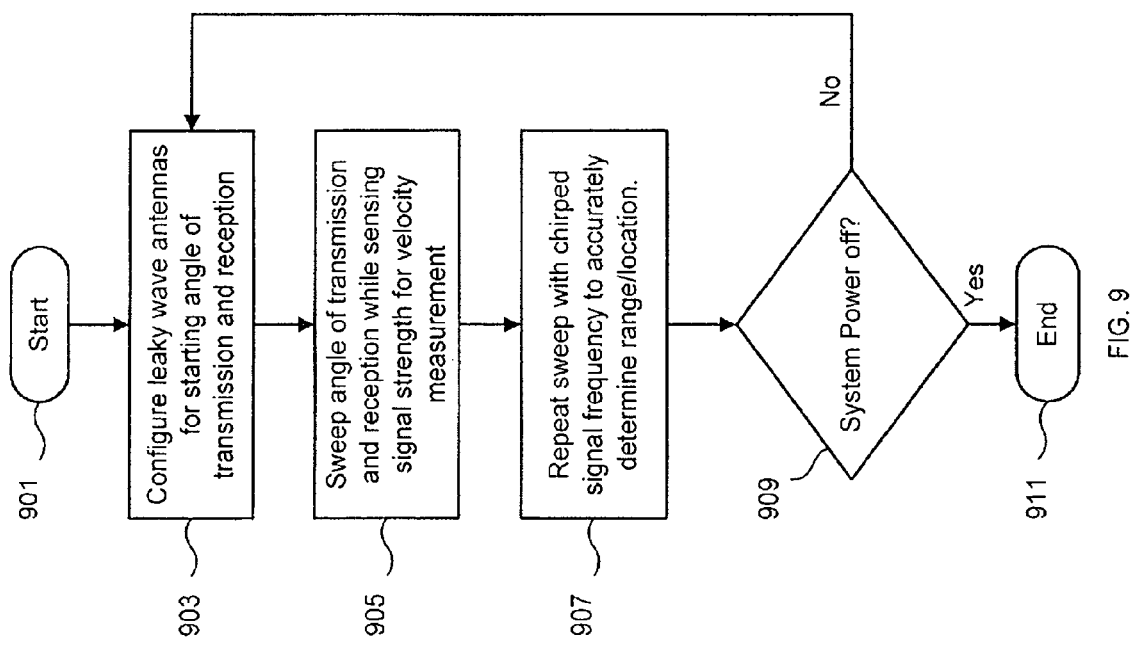
FIG. 9 is a block diagram illustrating exemplary steps for dynamic range detection and positioning utilizing leaky wave antennas, in accordance with an embodiment of the invention.

FIG. 9 is a block diagram illustrating exemplary steps for dynamic range detection and positioning utilizing leaky wave antennas, in accordance with an embodiment of the invention. Referring to FIG. 9, in step 903 after start step 901, the leaky wave antennas may be configured to transmit and receive signals at a starting angle. In step 905, the angle of transmission and reception of the leaky wave antennas may be swept across a field of view to reflect off of an object while measuring the Doppler shift of the reflected signal, thereby determining the relative velocity of the object. In step 907, the transmitted signal may be chirped, and the received reflected signal may be utilized to accurately determine the position of the reflecting object, particularly when the object is not in motion, and thus no Doppler shift. In step 909, in instances where the wireless device 150 is to be powered down, the exemplary steps may proceed to end step 911. In step 909, in instances where the wireless device 150 is not to be powered down, the exemplary steps may proceed to step 903 to configure the leaky wave antennas at a desired starting angle of transmission and reception.

In an embodiment of the invention, a method and system are disclosed for configuring one or more leaky wave antennas to enable communication of signals in a particular direction. RF signals that are reflected from an object may be received via the configured one or more leaky wave antennas, and a location of the object may be determined based on the received reflected RF signals. The velocity of the object may be determined based on a Doppler shift associated with the received reflected RF signals. A frequency may be chirped of an RF signal transmitted by the configured one or more leaky wave antennas. A location of the object may be determined based on the received reflected RF signals resulting from the chirping of the frequency of the transmitted RF signal.

In an embodiment of the invention, a method and system are disclosed for configuring a direction of transmission of one or more leaky wave antennas 164A-164C, 400, 420, 503A-503D, 600, 720, 730, and 809A-809F in a wireless device 150, reflecting a RF signal transmitted by the one or more leaky wave antennas 164A-164C, 400, 420, 503A-503D, 600, 720, 730, and 809A-809F off of an object 501, and measuring a Doppler shift of the reflected signal to determine a velocity of the object 501. A frequency of an RF signal transmitted by the one or more leaky wave antennas 164A-164C, 400, 420, 503A-503D, 600, 720, 730, and 809A-809F may be chirped and a location of the object 501 may be determined based on the chirped RF signal that is reflected by the object 501. A resonant frequency of the one or more leaky wave antennas 164A-164C, 400, 420, 503A-503D, 600, 720, 730, and 809A-809F may be configured utilizing micro-electro-mechanical systems (MEMS) deflection.

One or more leaky wave antennas 164A-164C, 400, 420, 503A-503D, 600, 720, 730, and 809A-809F may be situated along a plurality of axes in the wireless device 150. The one or more leaky wave antennas 164A-164C, 400, 420, 503A-503D, 600, 720, 730, and 809A-809F may comprise microstrip waveguides 720, wherein a cavity height of the one or more leaky wave antennas 164A-164C, 400, 420, 503A-503D, 600, 720, 730, and 809A-809F is dependent on spacing between conductive lines 723 and 725 in the microstrip waveguides 720. The one or more leaky wave antennas 164A-164C, 400, 420, 503A-503D, 600, 720, 730, and 809A-809F may comprise coplanar waveguides 730, wherein a cavity height of the one or more leaky wave antennas 164A-164C, 400, 420, 503A-503D, 600, 720, 730, and 809A-809F is dependent on spacing between conductive lines 731 and 733 in the coplanar waveguides 730. The one or more leaky wave antennas 164A-164C, 400, 420, 503A-503D, 600, 720, 730, and 809A-809F may be integrated in one or more integrated circuits 162 flip-chip bonded to one or more integrated circuit packages 167, in one or more integrated circuit packages 167 flip-chip bonded to one or more printed circuit boards 171, and/or one or more printed circuit boards 171.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for dynamic range detection and positioning utilizing leaky wave antennas.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A wireless communication device comprising:
    at least one leaky wave antenna configured to communicate signals; and
    circuitry configured to
        set a direction in which the at least one leaky wave antenna communicates the signals by adjusting a cavity height of the at least one leaky wave antenna,
        receive via the at least one leaky wave antenna reflected RF signals that are reflected from an object, and
        determine a location of said object based on said reflected RF signals.

2. The wireless communication device of claim 1 wherein the circuitry is further configured to determine a velocity of said object based on said reflected RF signals.

3. The wireless communication device of claims 2 wherein the circuitry is further configured to determine said velocity of said object based on a Doppler shift associated with said reflected RF signals.

4. The wireless communication device of claim 1, wherein the circuitry is further configured to chirp a frequency of an RF signal transmitted by said at least one leaky wave antenna.

5. The wireless communication device of claim 4 wherein the circuitry is further configured to determine said location of said object based on said reflected RF signals resulting from said chirping of said frequency.

6. The wireless communication device of claim 1 wherein the circuitry is further configured to set a resonant frequency of said at least one leaky wave antenna utilizing micro-electro-mechanical systems (MEMS) deflection.

7. The wireless communication device of claim 1 wherein said at least one leaky wave antenna includes plural leaky wave antennas situated along a plurality of axes in said wireless communication device.

8. The wireless communication device of claim 1 wherein said at least one leaky wave antenna includes microstrip waveguides.

9. The wireless communication device of claim 8 wherein the cavity height of said at least one leaky wave antenna is dependent upon spacing between conductive lines in said microstrip waveguides.

10. The wireless communication device of claim 1 wherein said at least one leaky wave antenna includes coplanar waveguides.

11. The wireless communication device of claim 10 wherein the cavity height of said at least one leaky wave antenna is present on spacing between conductive lines on said coplanar waveguides.

12. A method for wireless communication utilizing a wireless communication device that includes at least one leaky wave antenna, said method comprising:
    setting, with circuitry, a direction in which the at least one leaky wave antenna communicates signals by adjusting a cavity height of the at least one leaky wave antenna,
    receiving, by the circuitry via the at least one leaky wave antenna reflected RF signals that are reflected from an object; and
    determining, with the circuitry, a location of said object based on said reflected RF signals.

13. The method of claim 12 further comprising determining a velocity of said object based on said reflected RF signals.

14. The method of claim 12 further comprising chirping a frequency of an RF signal transmitted by said at least one leaky wave antenna.

15. The method of claim 14 further comprising determining said velocity of said object based on a Doppler shift associated with said reflected RF signals.

16. The method of claim 14 further comprising determining said location of said object based on said reflected RF signals resulting from said chirping of said frequency.

17. The method of claim 12 further comprising configuring a resonant frequency of said at least one leaky wave antenna utilizing micro-electro-mechanical systems (MEMS) deflection.

18. The method of claim 12 wherein said at least one leaky wave antenna includes plural leaky wave antennas situated along a plurality of axes in said wireless communication device.

19. The method of claim 12 wherein said at least one leaky wave antenna includes microstrip waveguides.

20. The method of claim 12 wherein said at least one leaky wave antenna includes coplanar waveguides.

\* \* \* \* \*